(12) United States Patent
Inoue

(10) Patent No.: US 8,487,804 B2
(45) Date of Patent: Jul. 16, 2013

(54) SUCCESSIVE APPROXIMATION AD CONVERSION CIRCUIT

(75) Inventor: Fumihiro Inoue, Tama (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 98 days.

(21) Appl. No.: 13/263,413

(22) PCT Filed: Mar. 16, 2010

(86) PCT No.: PCT/JP2010/054384
§ 371 (c)(1),
(2), (4) Date: Oct. 7, 2011

(87) PCT Pub. No.: WO2010/116864
PCT Pub. Date: Oct. 14, 2010

(65) Prior Publication Data
US 2012/0026023 A1 Feb. 2, 2012

(30) Foreign Application Priority Data
Apr. 8, 2009 (JP) ................................. 2009-093741

(51) Int. Cl.
*H03M 1/34* (2006.01)

(52) U.S. Cl.
USPC ............................ 341/163; 341/155; 341/161

(58) Field of Classification Search
USPC .......................... 341/161, 155, 172, 156, 163
See application file for complete search history.

(56) References Cited

U.S. PATENT DOCUMENTS 4,907,002 A * 3/1990 Kawada ........................ 341/172
5,057,841 A 10/1991 Veerhoek et al.
7,642,946 B2 * 1/2010 Wong et al. .................... 341/163
8,159,382 B2 * 4/2012 Srinivasa et al. .............. 341/156
2005/0184762 A1 * 8/2005 Yuki et al. ....................... 327/77

FOREIGN PATENT DOCUMENTS

| JP | 3-46414 A | 2/1991 |
| JP | 08-321779 A | 12/1996 |
| JP | 2004-96448 A | 3/2004 |

OTHER PUBLICATIONS

International Search Report dated Apr. 27, 2010 issued in International Appln. No. PCT/JP2010/054384.

* cited by examiner

*Primary Examiner* — Peguy Jean Pierre
(74) *Attorney, Agent, or Firm* — Holtz, Holtz, Goodman & Chick, PC

(57) ABSTRACT

A successive approximation AD conversion circuit has improved conversion accuracy without prolonging the time necessary for conversion. The successive approximation AD conversion circuit includes a plurality of amplifier stages cascaded together through coupling capacitances, and a comparator circuit which determines whether an input analog voltage is greater or less than comparison voltages. The comparator circuit includes a first comparator unit and a second comparator unit having a common initial amplifier stage among a plurality of amplifier stages, and, respectively, a first amplifier stage and second amplifier stage connected after the common stage through respective coupling capacitances; and first and second comparison point shift circuits connected respectively to input terminals of the first and second amplifier stages. The first and second comparison point shift circuits are configured to shift the comparison voltages by a specified amount in opposite directions, when amplifying the potential difference between the input analog voltage and the comparison voltages.

8 Claims, 15 Drawing Sheets

FIG.5

```
    0 1              ··· bit3 COMPARISON
      0 1            ··· bit2 COMPARISON
        0 1          ··· bit1 COMPARISON
+         0 1        ··· bit0 COMPARISON
―――――――――――
    0 1 1 1 ✗
    ⋮ ⋮ ⋮ ⋮
    2³ 2² 2¹ 2⁰
```

SUCCESSIVE APPROXIMATION AD CONVERSION CIRCUIT

This application is a U.S. National Phase Application under 35 USC 371 of International Application PCT/2010/054384 filed Mar. 16, 2010.

TECHNICAL FIELD

The present invention relates to a technique to improve conversion accuracy in a successive approximation AD conversion circuit, and more particularly to a preferred technique of using an AD conversion circuit having a chopper-type comparator.

BACKGROUND ART

In portable electronic devices such as cell phones, PDA (Personal Digital Assistants) and digital cameras, microprocessors are provided to control the system inside the devices, and the microprocessors perform control by monitoring temperature, voltage of batteries and so on. Therefore, sensors for detecting temperature, voltage of batteries and so on are provided in the devices, and microprocessors in which an A/D conversion circuit which converts analog signals from the sensors in to digital signals is installed are commonly used.

Moreover, as for the A/D conversion circuit installed in a microprocessor or the like, it is preferred that the circuit size is small. As for such A/D conversion circuit, an A/D conversion circuit including a so-called chopper-type comparator which uses CMOS inverters as amplifiers as shown in FIG. 14, for example, is known.

In such A/D conversion circuit, input signal Vin is sampled to a capacitance Cs by setting a voltage of logical threshold value of the inverter as the reference, by turning on the switch (sampling switch) SS1 in the input side of the analog signal in a state where input/output terminals of the CMOS inverters are short circuited by a sampling clock. Thereafter, the sampling switch SS1 is turned off, and a comparison voltage Vref is applied to the sampling capacitance Cs by turning on the switch SS2 in the input side of comparison voltage and the output changes by each of the inverters operating as an amplifier by blocking the input/output of the CMOS inverters. At this time, the input is amplified by inverters of three stages. Therefore, the output is a power voltage Vcc or a grounding potential GND approximately at the logical level, and judgment result of magnitude relation of Vin and Vref is outputted.

PRIOR ART DOCUMENT

Patent document 1: Japanese Patent Application Laid-Open Publication No. Hei 8-321779

DISCLOSURE OF THE INVENTION

Problem to be solved by the Invention

In a successive approximation AD conversion circuit, judgment of magnitude relation between Vin and Vref is repeated again by switching the comparison voltage Vref generated in the local DAC according to the judgment result. Thereby, AD conversion result can be obtained by gradually limiting candidates as shown in FIG. 15A. In such operation of repeating the judgment of magnitude relation, there is a problem that due to one miss judgment, especially, due to occurrence of misjudgment in early stage, erroneous judgments are repeated in after the misjudgment with an incorrect comparison voltage as shown in FIG. 15B, for example, and an erroneous AD conversion result is obtained ultimately. In view of the above, there is suggested an A/D conversion circuit in which the conversion accuracy is improved by increasing the comparison point to be two times by switching the output of the local DAC, that is, comparison voltage Vref, during comparison of one cycle (1 bit) (Patent Document 1).

Here, misjudgment occurs by carrying out judgment before the comparison voltage is changed completely due to noises mixing in and speeding up of clock. The invention described in the above patent document 1 has an advantage that can be used without changing the basic circuit arrangement. However, because the comparison operation is performed two times in one cycle, time needed for conversion becomes twice in the case of the same clock frequency. Moreover, when the clock frequency is increased to make the conversion time be short, there is a problem that the judgment is prone to be carried out before the comparison voltage is changed completely and errors can occur easily in the comparison.

The present invention was achieved in view of the above problems and an object of the present invention is to improve the conversion accuracy by decreasing erroneous comparison judgments without prolonging the time needed for conversion in the successive approximation AD conversion circuit.

Means for Solving the Problem

In order to achieve the above object, a successive approximation AD conversion circuit of the present invention includes a comparator circuit having a plurality of amplifier stages cascaded via coupling capacitances, which judges a magnitude of an input analog voltage and comparison voltages, a register which sequentially takes in and holds judgment results of the comparator circuit, and a local DA conversion circuit which converts values of the register to voltages and generates the comparison voltages, and the comparator circuit includes a first comparator unit and a second comparator unit having a common first amplifier stage among the plurality of amplifier stages, the first comparator unit and the second comparator unit respectively having a first amplifier stage and a second amplifier state connected after the common first amplifier via coupling capacitances, a first comparison point shift circuit connected to an input terminal of the first amplifier stage and a second comparison point shift circuit connected to an input terminal of the second amplifier stage, and, a logic circuit which generates a predetermined code according to an output of the first comparator unit and an output of the second comparator unit and generates a value to store in the register by performing a calculation process to the generated code, and the first comparison point shift circuit and the second comparison point shift circuit operate so as to shift the comparison voltages by a specified amount in directions opposite from each other when amplifying a potential difference between the input analog voltage and the comparison voltages in the first comparator unit and the second comparator unit.

According to the above configuration, misjudgment hardly occurs especially in high order bits because comparisons are performed at two comparison points avoiding the original comparison point, and the time needed for the conversions is not prolonged because comparison judgments are carried out parallely in the first comparator unit and the second comparator unit. Further, the number of devices to be added can be less because the local DA conversion circuit and the first amplifier stage are commonly used. Furthermore, although there needs to be an advanced matching when a plurality of local DA conversion circuits are provided, there is no need for matching because the local DA conversion circuit is commonly used and characteristics of the first comparator unit and the second comparator unit do not deviate from each other as much because the first amplifier stage is commonly used.

Preferably, three types of codes are set for the predetermined code to be generated by the logic circuit, and when a first code is generated, the local DA conversion circuit generates a voltage higher than a comparison voltage in a previous comparison operation in a next comparison operation, when a second code is generated, the local DA conversion circuit generates a voltage same as a comparison voltage in a previous comparison operation in a next comparison operation, and when a third code is generated, the local DA conversion circuit generates a voltage lower than a comparison voltage in a previous comparison operation in a next comparison operation.

According to the above, by the comparison voltage in the next comparison operation being changed according to the previous comparison result, even when an erroneous comparison occurs, judgments can be guided in a direction so as to correct the error in the comparison operations after the erroneous comparison, and further, conversion results with less errors can be obtained ultimately.

Preferably, the first comparison point shift circuit and the second comparison point shift circuit respectively include a first capacitance and a second capacitance in which one terminal of each of the first capacitance and the second capacitance is connected to the input terminal of the first amplifier stage or the input terminal of the second amplifier stage, and a first switch which switches a voltage to be applied to the other terminal of the first capacitance and a second switching switch which switches a voltage to be applied to the other terminal of the second capacitance, and the first switching switch and the second switching switch switching the voltages in different directions from each other. Accordingly, the first comparison point shift circuit and the second comparison point shift circuit can be realized with relatively simple circuits.

Further, preferably, when a resolution of an AD conversion circuit is n-bit, a potential difference between an upper limit and a lower limit of an AD convertible voltage range is FS and a deviation amount of the comparison voltages which are shifted by the first comparison point shift circuit and the second comparison point shift circuit is $\Delta V$, a switching voltage or capacitance values of the first capacitance and the second capacitance change so as to fulfill $\Delta V \leq FS/2^n * 2^{(k-2)}$ when performing a comparison operation of $k^{th}$-bit.

By making $\Delta V$ be smaller as the number of times of comparison increases within the range that fulfills the above inequality, conversion judgments can be performed with even less errors. However, there is no need to make $\Delta V$ be smaller every time, and $\Delta V$ can be the same value all the way to the end as long as $\Delta V \leq FS/2^n * 2^{(k-2)}$ is fulfilled or $\Delta V$ can be made to be smaller every other times. By decreasing the number of times of changing $\Delta V$, area of the circuit can be small and the control can be simplified. Further, instead of changing either of the switching voltage and the capacitance values of the first capacitance and the second capacitance, both of the switching voltage and the capacitance values of the first capacitance and the second capacitance may be changed within the range that fulfills the above inequality.

Further, preferably, the local DA conversion circuit includes a capacitance array including a plurality of weight capacitances in which one terminal of each of the weight capacitances is commonly connected to an input terminal of the comparator circuit, and a switching switch circuit which can apply the input analog voltage, a first reference voltage or a second reference voltage to the other terminal of each of the plurality of weight capacitances, the local DA conversion circuit has a ladder resistance provided between a first node to which the first reference voltage is applied and a second node to which the second reference voltage is applied, and a selection unit which takes out a potential from any of the nodes of the ladder resistance, a connection condition of the switching switch circuit is decided according to values of a plurality of bits in a higher order side of the register, and the switching switch circuit applies the input analog voltage to the other terminal of each of the plurality of weight capacitances during a first period and applies the first reference voltage or the second reference voltage to the other terminal of each of the plurality of weight capacitances according to a value of the first register during a second period, a potential to be taken out is decided according to values of a plurality of bits in a lower order side of the register in the selection unit, and the potential taken out by the selection unit is applied to a terminal of a capacitance having a smallest capacitance value among the plurality of weight capacitances during the second period by the switching switch circuit, and voltages switched by the first switching switch and the second switching switch in the first comparison point shift circuit and the second comparison point shift circuit are taken out from any of the nodes of the ladder resistance of the local DA conversion circuit.

As described above, by configuring the local DA conversion circuit with the capacitance array and the ladder resistance, the circuit size of the local DA conversion circuit can be prevented from being large even when the number of bits to be converted is large in the AD conversion circuit, and the ladder resistance of the local DA conversion circuit can be commonly used as a generation unit of switching voltage to be used in the comparison point shift circuits. Therefore, the circuit size can be prevented from being large.

Further, preferably, the comparator circuit is configured to have CMOS inverters as the amplifier stages, switch devices provided between input/output terminals of each of the CMOS inverters, and coupling capacitances provided between the CMOS inverters, to take in the input analog voltage by setting the voltage as a reference by applying a voltage corresponding to a logic threshold value of the CMOS inverters to one terminal of the sampling capacitance by the switch device being turned on during the first period, and to amplify a potential of the sampling capacitance in the CMOS inverters by an electric charge according to a potential difference between the input analog voltage and the comparison voltages being charged to the sampling capacitance and the switch device being turned on during the second period.

Accordingly, comparing to the case where comparison circuit in which the differential amplifier circuits in which the number of devices that constitute the circuit is large are used as amplifier stages, area dedicated for the circuit can be small and the conversion operations can be performed at high speed.

Further, the comparator circuit is configured to include differential amplifier circuits as the amplifier stages, switch devices provided between input/output terminals or between an input terminal and a constant potential point of each of the differential amplifier circuits, and a coupling capacitances provided between the differential amplifier circuits, to take in the input analog voltage in the sampling capacitance by the switch device being turned on during the first period, and to amplify a potential difference between the input analog voltage taken in to the sampling capacitance and the comparison voltages from the local DA conversion circuit in the differential amplifier circuits by the switch device being turned off during the second period.

By configuring the amplifier stages of the comparison circuit with the differential amplifier circuits as described above, conversion can be performed with higher accuracy than in the case where configured with CMOS inverters. Therefore, it is preferred to accordingly use the comparison circuit having differential amplifier circuits ad amplifier stages when designing an AD conversion circuit in which the priority is given to accuracy, and use the comparison circuit having CMOS inverters as amplifier stages when designing an AD conversion circuit in which the priority is given to high speed or low cost.

Advantageous Effect of the Invention

According to the present invention, there is an advantage that erroneous comparison judgments can be decreased without prolonging the time needed for conversion and that conversion accuracy can be improved in the successive approximation AD conversion circuit.

BRIEF DESCRIPTION OF THE DRAWINGS

FIG. 5 This is an explanatory drawing showing a method of code processing showing comparison result of each bit in the AD conversion circuit of the embodiment, wherein 4-bit AD conversion is taken as an example.

BEST MODE FOR CARRYING OUT THE INVENTION

Hereinafter, preferred embodiments of the present invention will be described based on the drawings.

Figure 1:
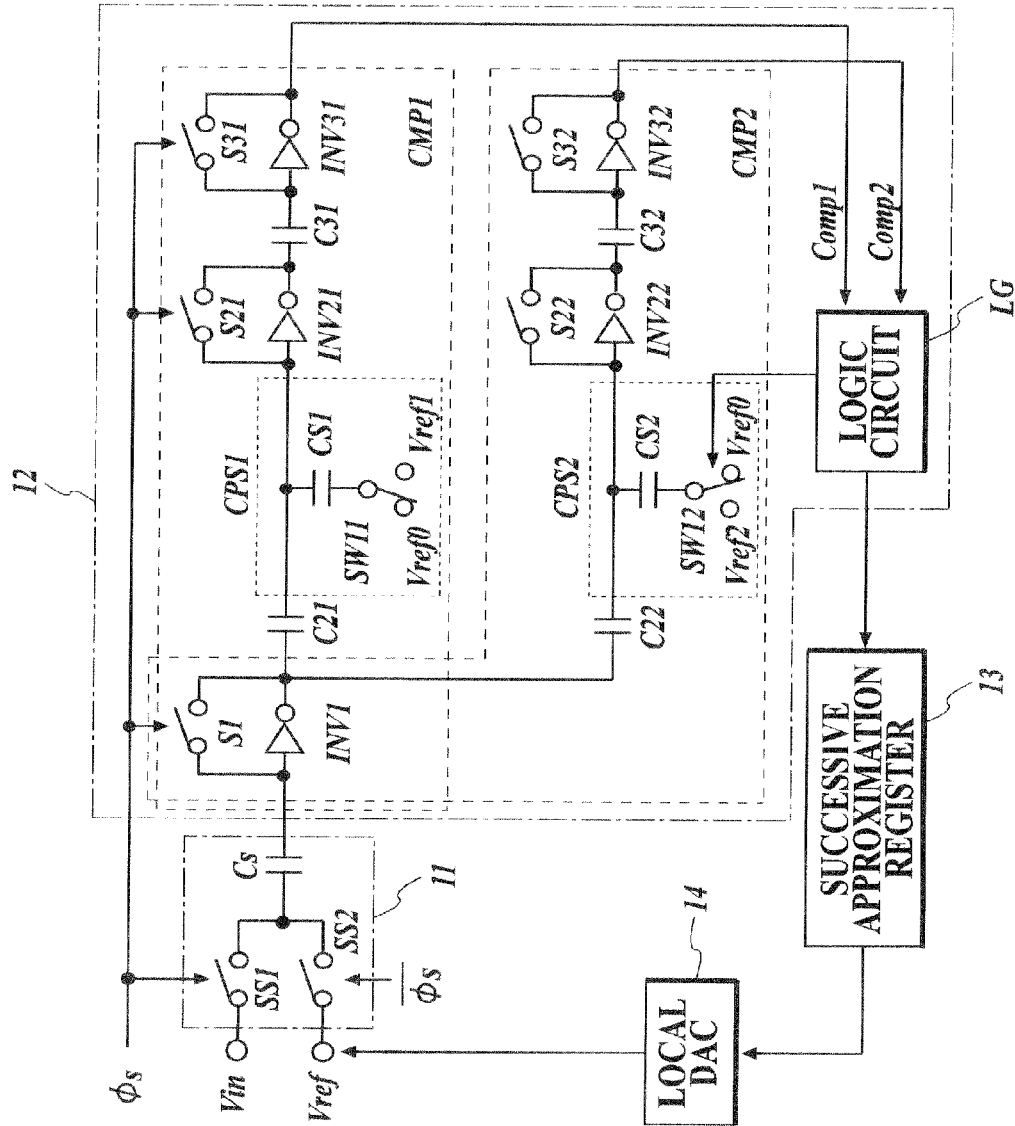
FIG. 1 This is a circuit arrangement showing an embodiment of a successive approximation AD conversion circuit according to the present invention.

FIG. 1 is an embodiment of the successive approximation AD conversion circuit according to the present invention. The AD conversion circuit shown in FIG. 1 includes a sample hold circuit 11 which holds a difference voltage by alternately sampling an analog input Vin inputted to an analog input terminal and a comparison voltage Vref applied to a reference voltage terminal, a chopper-type comparator 12 which amplifies the difference voltage which is sampled by the sample hold circuit 11, a successive approximation register 13 which sequentially takes in outputs of the chopper-type comparator 12 and a local DA conversion circuit 14 which outputs a voltage obtained by performing DA conversion to the output code of the register 13 to the sample hold circuit 11 as a comparison voltage Vref as an internal switch is switched by a signal outputted from the register 13.

The sample hold circuit 11 is constituted of a pair of sampling switches SS1 and SS2, wherein the switches SS1 and SS2 are turned on/off in a complementary manner by a sampling clock ϕs and a clock ϕs having reversed phase of the sampling clock ϕs, and a sampling capacitance which is connected between a connection node of the switches SS1 and SS2 and an input terminal of the shopper-type comparator 12.

Further, the chopper-type comparator 12 includes a first comparator unit CMP 1 in which three CMOS inverters INV1, INV21 and INV31 are cascaded via coupling capacitances C21 and C31, switches S1, S21 and S31 for short-circuiting between input/output terminals are respectively provided at the inverters and a comparison point shift circuit CPS1 is connected to the input side of the second inverter INV21, a second comparator unit CMP2 in which the first inverter INV1 is commonly used, two CMOS inverters INV22 and INV32 are cascaded via coupling capacitances C22 and C32 after the first inverter INV1 and a comparison point shift circuit CPS2 is connected to the input side of the inverter INV22, and a logic circuit LG. The outputs of the first and second comparator units CMP1 and CMP2 are supplied to the logic circuit LG, and the logic circuit LG generates control signals of the comparison point shift circuits CPS1 and CPS2 based on the two outputs.

Figure 2:
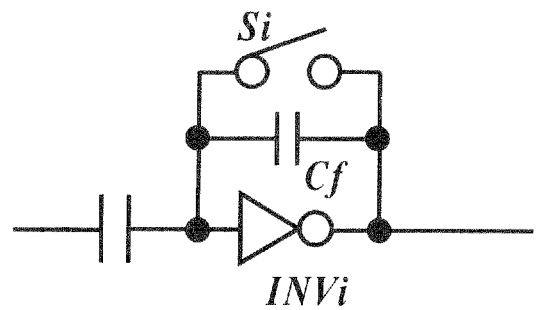
FIG. 2 This is a circuit arrangement showing a modification example of an amplifier stage which constitutes the AD conversion circuit of the embodiment.

Here, a CMOS inverter INVi which is made to have a gain by connecting a feedback capacity Cf between an input terminal and an output terminal as shown in FIG. 2 can be used as the above CMOS inverters.

In the comparator unit CMP1, by the inputs/outputs of the inverters INV1, INV 21 and INV 31 being short-circuited due to the switches S1, S21 and S31 being turned on during a sampling period, an input potential and an output potential of each of the inverters be equal to the logic threshold value VLT thereof. Therefore, in the sample hold circuit 11, an input analog voltage Vin is to be sampled to the sampling capacitance Cs by setting VLT as the reference when the switch SS1 in the input terminal side is turned on by the sampling clock φs. That is, an electric charge according to a potential difference between VLT and Vin is to be charged to Cs. Further, voltages (VLT21−VLT1) and (VLT31−VLT21) corresponding to the differences of logic threshold values of the inverters are respectively charged to the coupling capacitances C21 and C31. In the inverters INV22 and INV32 of the comparator unit CMP2, the switches S22 and S32 between the input/output terminals are tuned on, and voltages corresponding to the differences of logic threshold values of the inverters are respectively charged to the coupling capacitances C22 and C32, similarly as in the above description.

At the time of comparison judgment (holding period), the switch SS2 in the reference side is turned on by the sampling clock/φs in the sample hold circuit 11. Thereby, an electric charge according to the potential difference (Vref−Vin) between the input analog voltage Vin and the comparison voltage Vref remains in the sampling capacitance Cs. In the comparator 12, by the input/output of each of the inverters INV1, INV21 and INV 31 being blocked by the switches S1, S21 and S31 being turned off by the φs, each of the inverters operates as an amplifier and the output changes according to the input potential.

At this time, a potential difference (Vref−Vin) is transmitted to the input terminal of the first inverter INV1 via the sampling capacitance Cs, and the potential difference is to be amplified progressively by the inverters INV1, INV21 and INV 31 in the first comparator unit CMP1. Similarly, the potential difference is to be amplified progressively by the inverters INV1, INV22 and INV32 in the second comparator unit CMP2. As a result, the result of comparison between the input analog voltage Vin and the comparison voltage Vref is expressed in the outputs of the inverters INV31 and INV32.

In this embodiment, the comparison point shift circuit CPS1 is constituted of a capacitance CS1 in which one terminal thereof is connected to the input terminal of the inverter INV21, and a switch SW11 which is connected to the other terminal of the capacitance and which can switch between predetermined reference voltages Vref0 and Vref1. Further, the comparison point shift circuit CPS2 is constituted of a capacitance CS2 in which one terminal is connected to the input terminal of the inverter INV22 and a switch SW12 which is connected to the other terminal of the capacitance and which can switch between predetermined reference voltages Vref0 and Vref2. The capacitances CS1 and CS2 are the same and can have the same capacitance value as the smallest capacitance in the weight capacitances which constitute the local DA conversion circuit 14, for example.

The switches SW11 and SW12 perform switching operation of voltages so that voltages which change in opposite direction from each other be applied to the SS1 and SS2, respectively. That is, the switching switches SW11 and SW12 and the applied voltages are controlled to, first, apply the same voltage which is reference voltage Vref0, and then, to apply voltage Vref1 which is greater than Vref0 to one of CS1 and CS2 and to apply voltage Vref2 which is smaller than Vref to the other of CS1 and CS2. Further, switching of the switches SW11 and SW12, that is, switching of the reference voltages are carried out in synchronization with the sampling clock φs. Here, different voltages Vref1 and Vref2 may be applied first instead of applying the same voltage of reference voltage Vref0 first, and then, voltage Vref1' greater than the voltage Vref1 which is applied first may be applied to one of CS1 and CS2 and voltage Vref2' smaller than Vref2 may be applied to the other of CS1 and CS2.

As described above, in the comparison point shift circuit CPS1, the voltage to be applied to a terminal of the capacitance CS1 is switched so as to be increased such as Vref0→Vref1 between at the time of sampling and at the time of comparison, and on the other hand, in the comparison point shift circuit CPS2, the voltage to be applied to a terminal of the capacitance CS2 is switched so as to be decreased such as Vref0→Vref2 between at the time of sampling and at the time of comparison. Thereby, electric charge is taken out from the capacitance C21 in the comparison point shift circuit CPS1 and electric charge is injected to the capacitance C22 in the comparison point shift circuit CPS2. As a result, judgment results similar to when comparisons are carried out by changing the comparison voltage (comparison point) to Vref+ΔV1 in the comparison point shift circuit CPS1 and by changing the comparison point to Vref−ΔV2 in the comparison point shift circuit CPS2 can be outputted.

The amount of changes ΔV1 and ΔV2 at the above comparison points can be expressed as input equivalent values by dividing the voltages which change by distributing the electric changes injected by the capacities Cs1 and CS2 by the changes in applied voltage ΔVref1(=Vref1−Vref0), ΔVref2 (=Vref0−Vref2) with the capacities C21 and C22, respectively, by a gain A1 of the inverter INV1. This can be expressed in the following formulas.

$$\Delta V1 = CS1/(C21+CS1) \times \Delta Vref1/A1$$

$$\Delta V2 = CS2/(C22+CS2) \times \Delta Vref2/A1$$

In the AD conversion circuit having n-bit resolution, a conversion results with less miss judgment can be obtained by setting ΔVref1, ΔVref2 and CS1, CS2 so as to fulfill ΔV1, ΔV2 ≦ FS/$2^n * 2^{(k-2)}$ when comparing $k^{th}$-bit. Here, FS is a potential difference between the upper limit and the lower limit of voltage range FSR (Full Scale Range) in which AD conversion can be carried out. As in the embodiment of FIG. 1, in a case where values of the capacitances CS1 and CS2 are fixed, the voltage differences ΔVref1 and ΔVref2 before and after switching can be changed for every comparison operation. However, there is no need to make ΔV be smaller every time, and the same value can be used all the way to the end as long as ΔV ≦ FS/$2^n * 2^{(k-2)}$ is fulfilled and ΔV can be made to be smaller every other times. By decreasing the number of times of changing ΔV, area of the circuit can be small and the control thereof can be simple.

Figure 3:
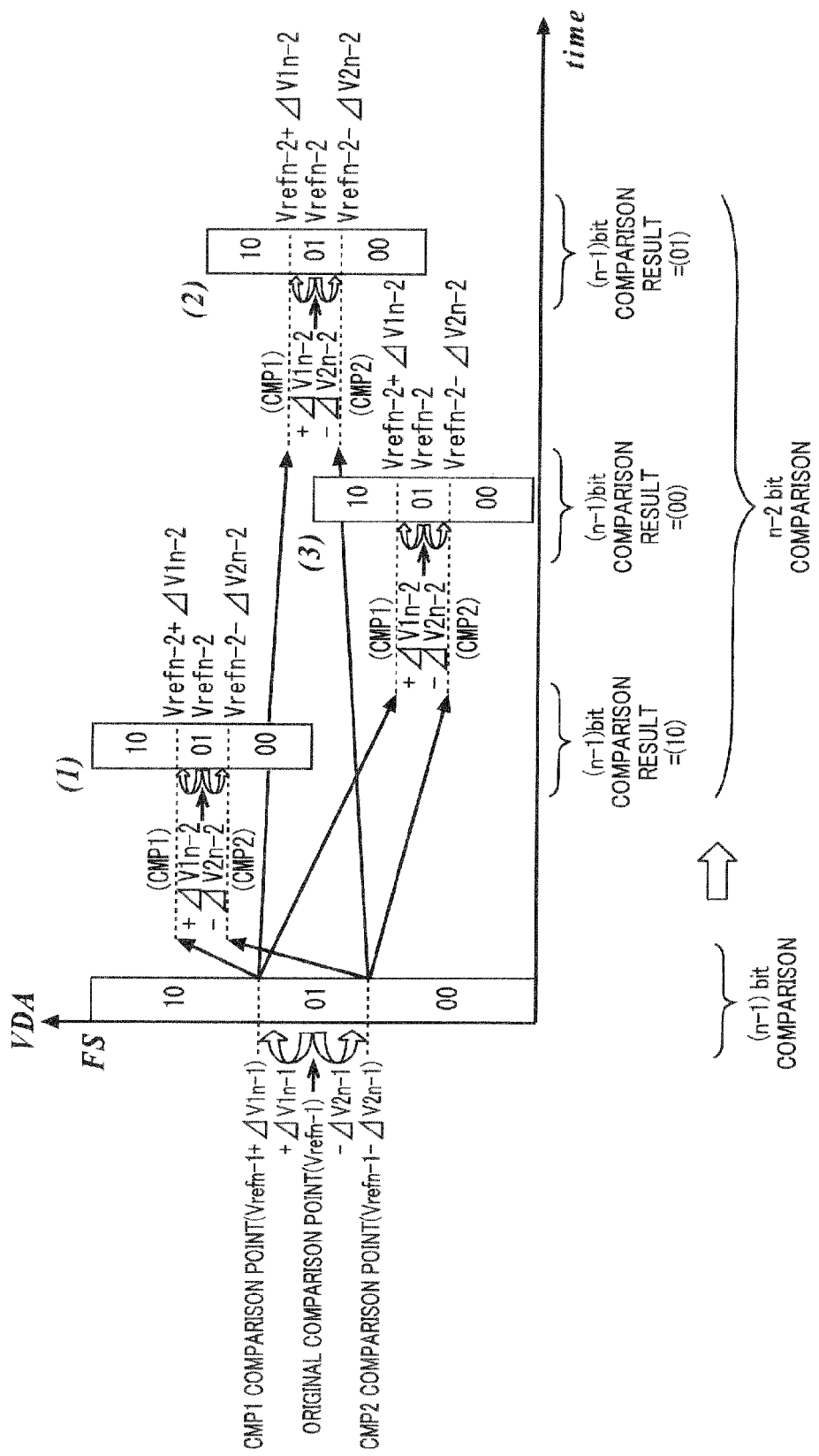
FIG. 3 This is an explanatory drawing of operation where portions of comparison operation of $(n-1)^{th}$ bit and comparison operation of $(n-2)^{th}$ bit in the AD conversion circuit of the embodiment are taken out.

Here, the principle of operation of the chopper-type comparator 12 of this embodiment will be described by using FIG. 3. In FIG. 3, portions of comparison of $(n-1)^{th}$-bit and comparison of $(n-2)^{th}$-bit are taken out and shown. As shown in the e drawing, in this embodiment, two comparison points are set avoiding the original comparison point, that is, the comparison point set when there is only one comparator, shifting above and below the original point. Then, deviation amounts of the comparison points are made to be small as the number of times of comparison increases. As described above, instead of making ΔV be small in every comparison operation, ΔV can be set so as to fulfill ΔV ≦ FS/$2^n * 2^{(k-2)}$ and the same value can be used all the way to the end or ΔV can be made to be smaller every other comparison.

Further, judgment results are expressed in three types of codes which are (1, 0), (0, 1) and (0, 0) according to input voltage range. Therefore, a conversion circuit which is constituted of a logic gate which generates the above three types of codes based on outputs of the comparator units CMP1 and CMP2 is provided in the logic circuit LG of FIG. 1. The conversion circuit is configured so as to generate (1, 0) code when the outputs of the comparator units CMP1 and CMP2 are 1 and 1, respectively, generates (0, 1) code when the outputs of the CMP1 and CMP2 are 0 and 1, respectively, and generates (0, 0) code when the outputs of the CMP1 and CMP2 are 0 and 0, respectively. Such circuit can be realized by, such as, AND gate and exclusive OR gate. The comparison point of the comparator unit CMP2 is always set to be lower, and because the outputs of CMP1 and CMP2 will never be 1 and 0, respectively, there is no need to consider a code corresponding to such case.

Next, at the time of comparison operation of $(n-2)^{th}$-bit, according to the three types of codes which indicates the judgment result of $(n-1)^{th}$-bit, comparison is carried out by moving both comparison points to be higher as shown in (1) when the judgment result is (1, 0). Further, when the judgment result of $(n-1)^{th}$-bit is (0, 1), comparison is carried out by moving the comparison points so as to be close to each other as shown in (2), and when the judgment result is (0, 0), comparison is carried out by moving both comparison points to be lower as shown in (3). That is, according to the judgment result (code) of the previous comparison, the next comparison is to be carried out within any of the ranges of (1), (2) and (3).

Figure 4:
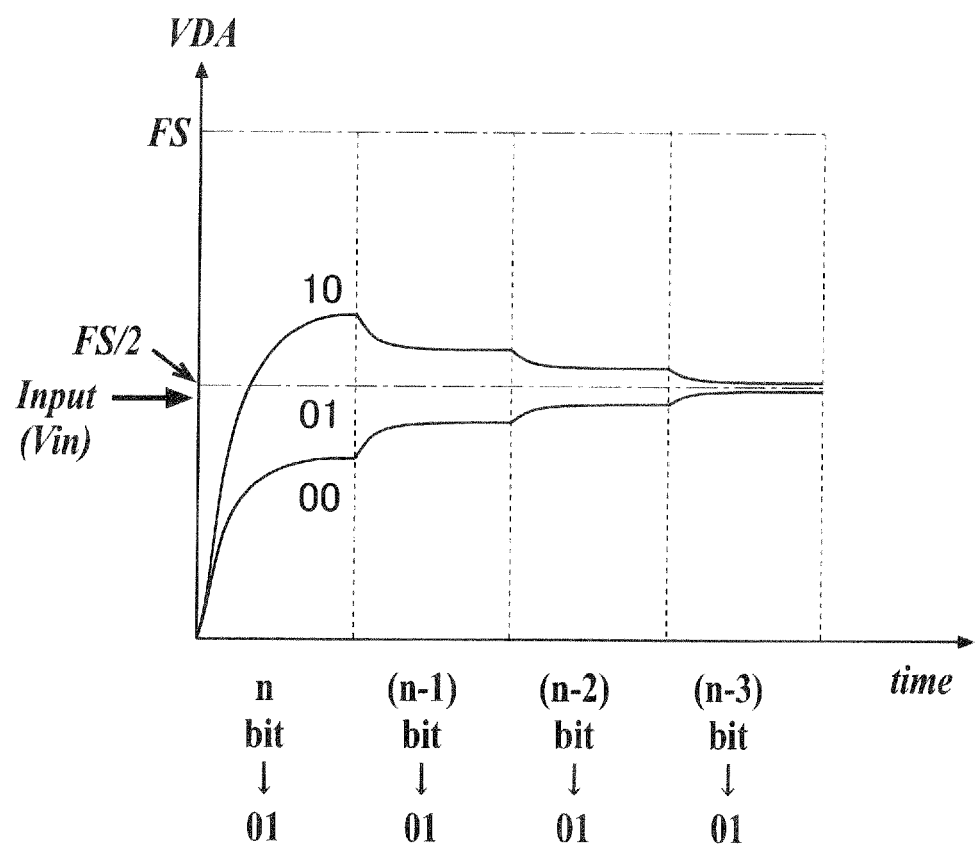
FIG. 4 This is an explanatory drawing showing an example of change in output voltage of the local DAC during conversion operation when AD conversion is performed in the AD conversion circuit of the embodiment.

In FIG. 4, an example of change in output voltage of the local DAC during conversion operation when AD conversion is carried out according to the above principle is shown. This drawing corresponds to FIG. 15 (B) which shows change in output voltages of the local DAC when AD conversion is carried out at the original comparison point by using a conventional chopper-type comparator. When comparing FIG. 4 to FIG. 15 (B), it is found that when this embodiment in which comparison is carried out by avoiding the original comparison point is applied, misjudgment hardly occurs in a high order bit and the conversion results with less error can be obtained ultimately in a case where the potential of the input voltage Vin is close to the original comparison point.

Here, results (three types of 2-bit codes) obtained by repeating the above comparison are added by displacing each of the codes by one digit and processed so as to round off the least significant bit as shown in FIG. 5 to obtained the original AD conversion result. Therefore, the logic circuit LG of FIG. 1 is provided with a calculation circuit constituted of a bit shifter (shift register), an adder and the like. The processing of the least significant bit is not limited to rounding off and the process can be rounding up. The calculation result of FIG. 5 is to be stored in the successive approximation register 13. In a case where the AD conversion circuit is installed in a LSI such as a microprocessor having a CPU, the configuration may be such that the CPU carries out the above calculation.

Figure 6:
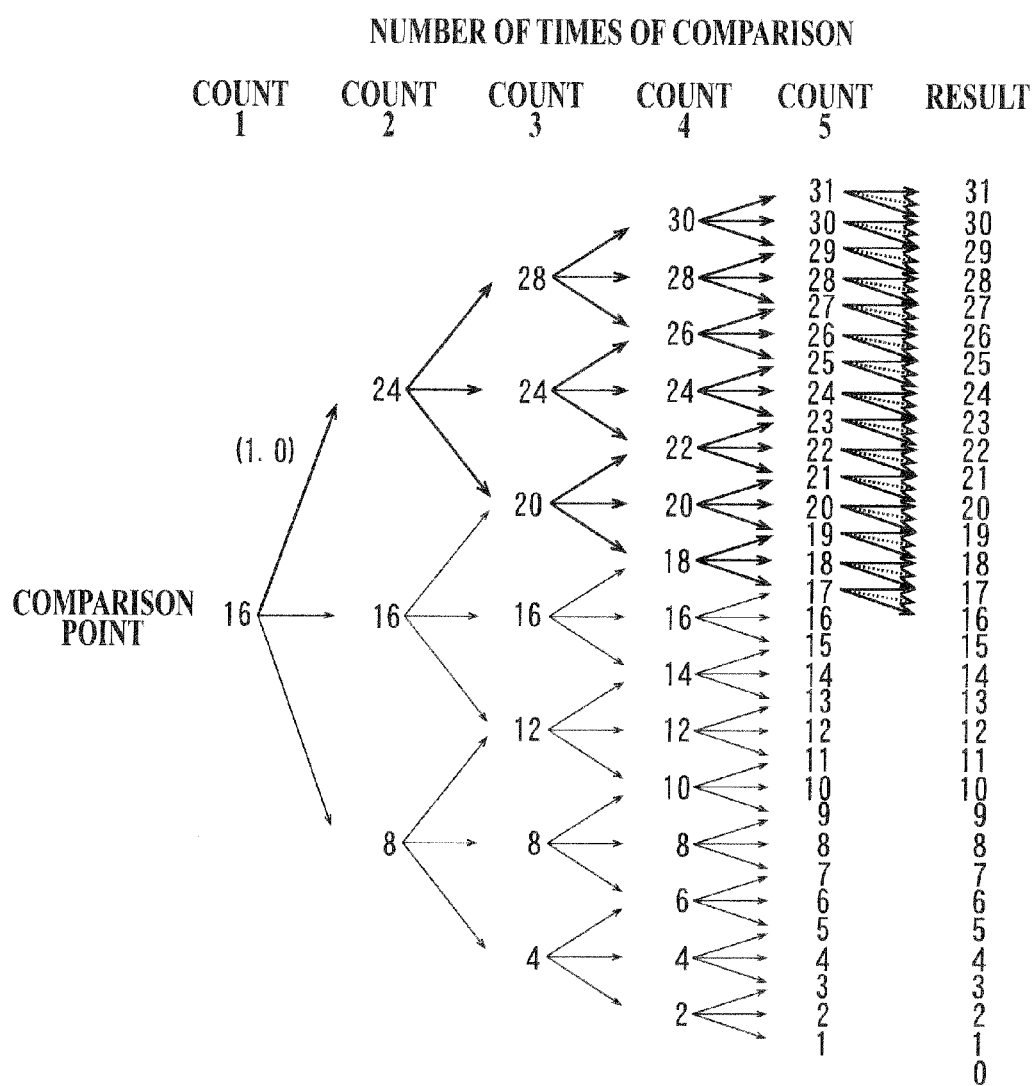
FIG. 6 This is an explanatory drawing of conversion showing progress of AD conversion when the first judgment result is (1, 0) in the AD conversion circuit of the embodiment.
Figure 7:
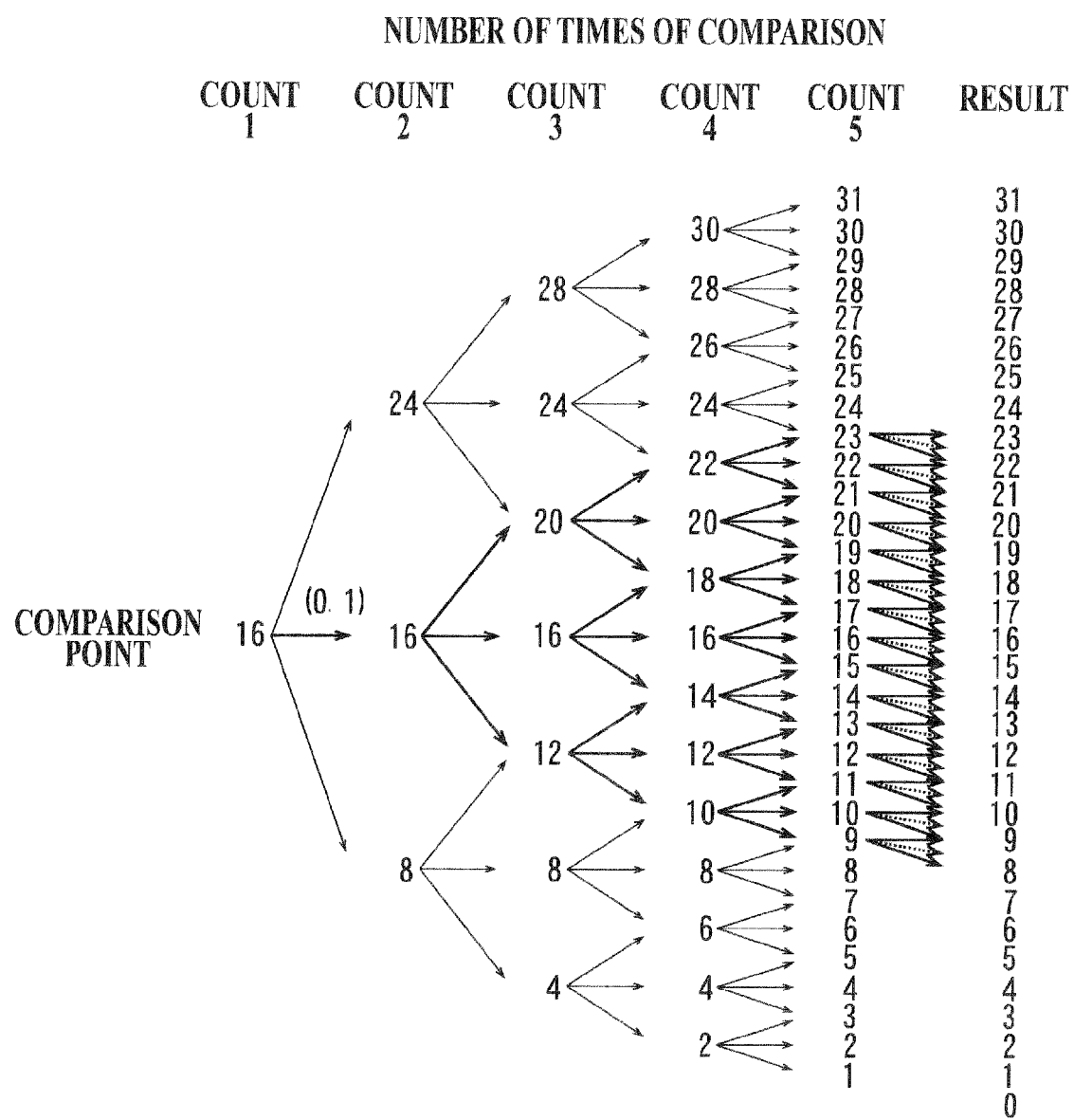
FIG. 7 This is an explanatory drawing of conversion showing progress of AD conversion when the first judgment result is (0, 1) in the AD conversion circuit of the embodiment.
Figure 8:
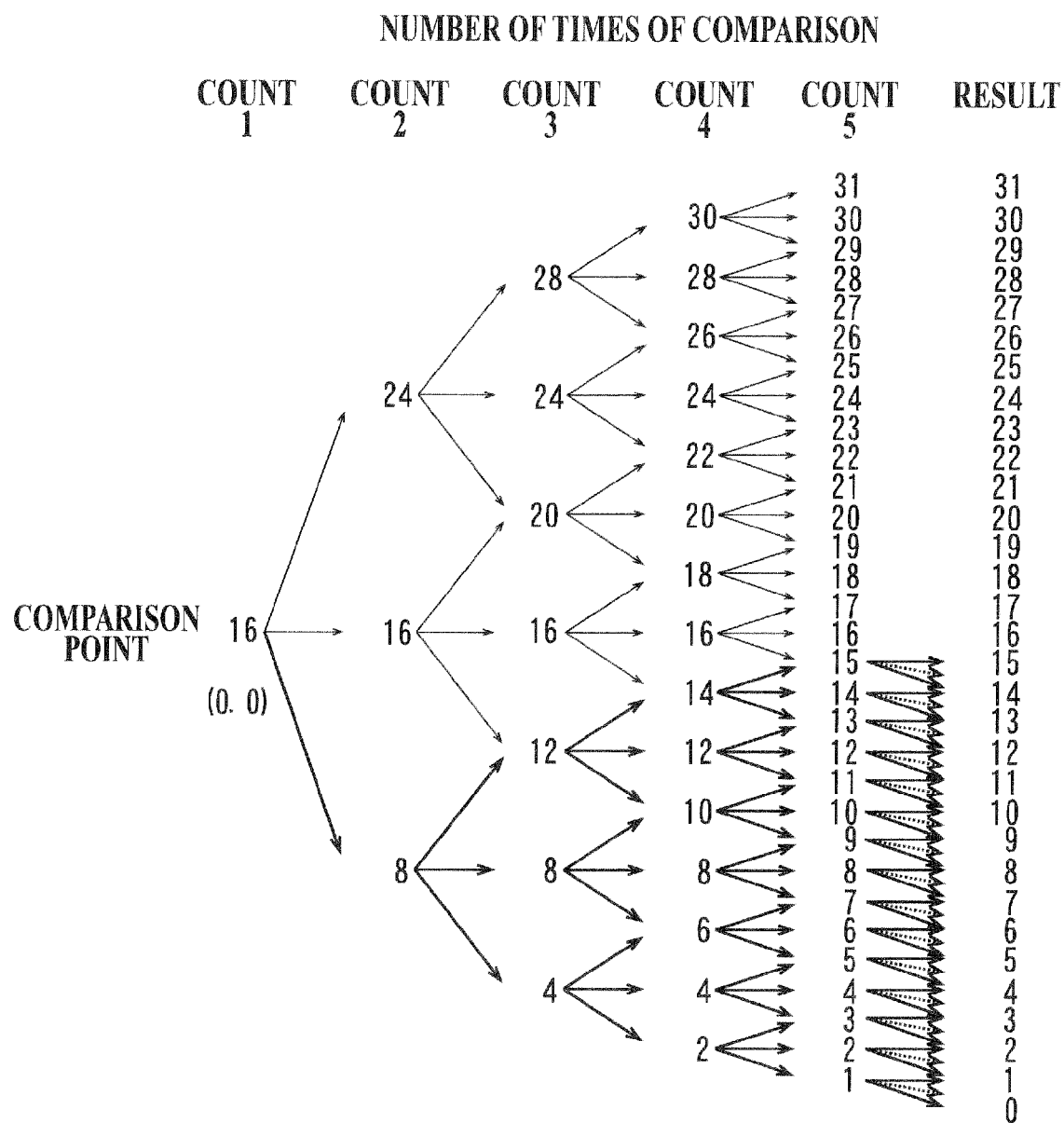
FIG. 8 This is an explanatory drawing of conversion showing progress of AD conversion when the first judgment result is (0, 0) in the AD conversion circuit of the embodiment.

FIG. 6 shows a possible transition of comparison operations after when (1, 0) code is generated in the first judgment, FIG. 7 shows a possible transition of comparison operations after when (0, 1) code is generates in the first judgment and FIG. 8 shows a possible transition of comparison operations after (0, 0) code is generates in the first judgment, in the 5-bit AD conversion circuit in which the above described embodiment is applied. The arrows shown in doted line in the fifth judgment correspond to a case where (0, 1) code is generated and indicate that the process of rounding off or such as shown in FIG. 5 is carried out.

Figure 15A:
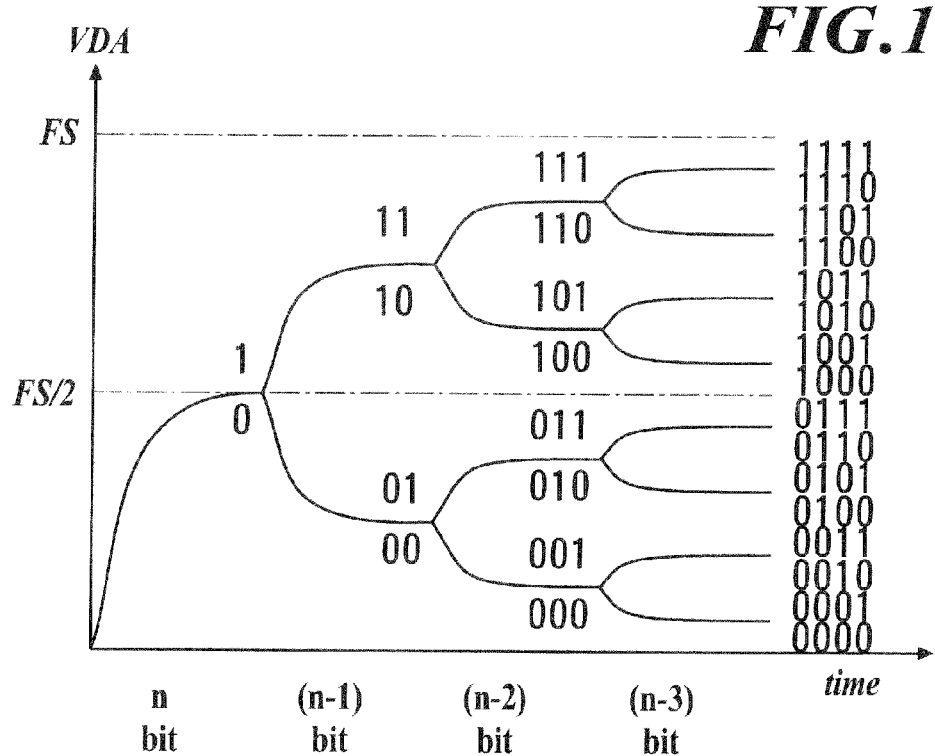
FIG. 15A This is an explanatory drawing of operation showing a principle of operation of conversion in a conventional typical AD conversion circuit.
Figure 15B:
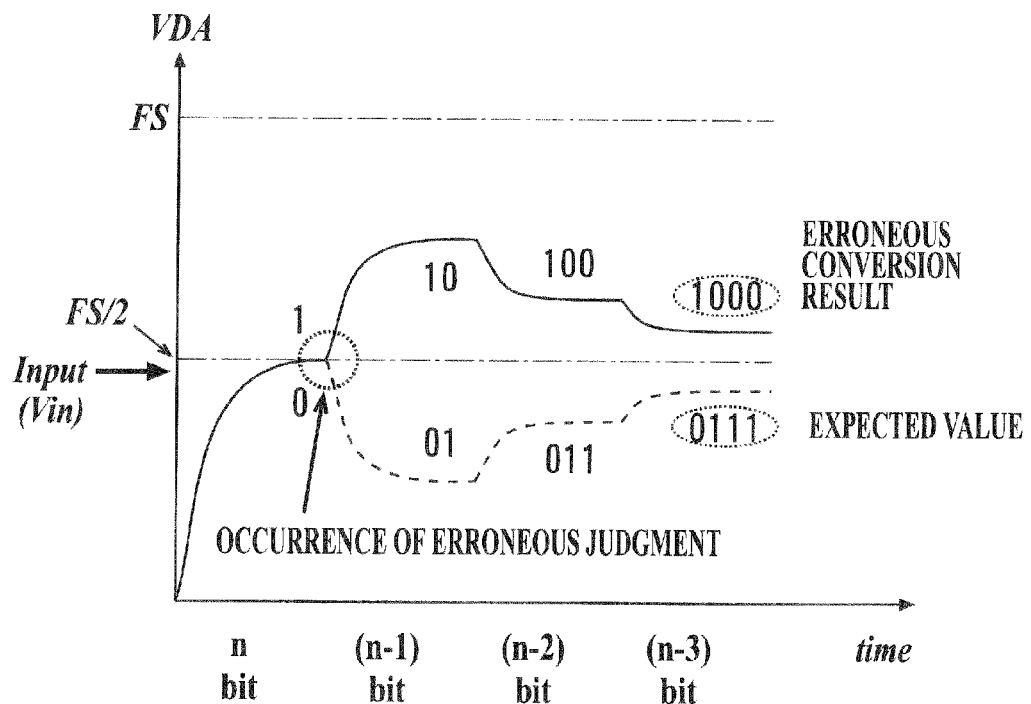
FIG. 15B This is an explanatory drawing of operation showing conversion operation when a misjudgment occurs in the conventional typical AD conversion circuit.

As described above, according to the AD conversion circuit of this embodiment, by adding the second comparator unit which is constituted of two inverters and two capacitance devices for AC coupling and comparison point shift circuits respectively provided to the comparators to the conventional chopper-type comparator (corresponding to the first comparator) of FIG. 15, there is an advantage that AD conversion result having high accuracy can be obtained without prolonging the conversion time.

Moreover, because the first inverter INV1 is commonly used by two comparators, it is configured in such way that errors hardly occur among the outputs of the two comparator units and the size of the circuit to be added can be small and a drastic cost increase can be avoided.

Further, in the above embodiment, description is given that the deviation amount of comparison points are to be small as the number of times of comparison increases. However, $\Delta Vref1$ and $\Delta Vref2$ or CS1 and CS2, or $\Delta Vref1$ and $\Delta Vref2$ and CS1 and CS2 can be set so as to fulfill the condition of $\Delta Vk \leq FS/2^n * 2^{(k-2)}$ and so that the deviation amount of the comparison points be the same through out the comparisons of plurality of bits such as $\Delta Vk=\Delta Vk-1=\Delta Vk-2$ . . . . Thereby, the number of elements that constitute the comparison point shift circuits can be decreased and the area can be small.

Figure 9:
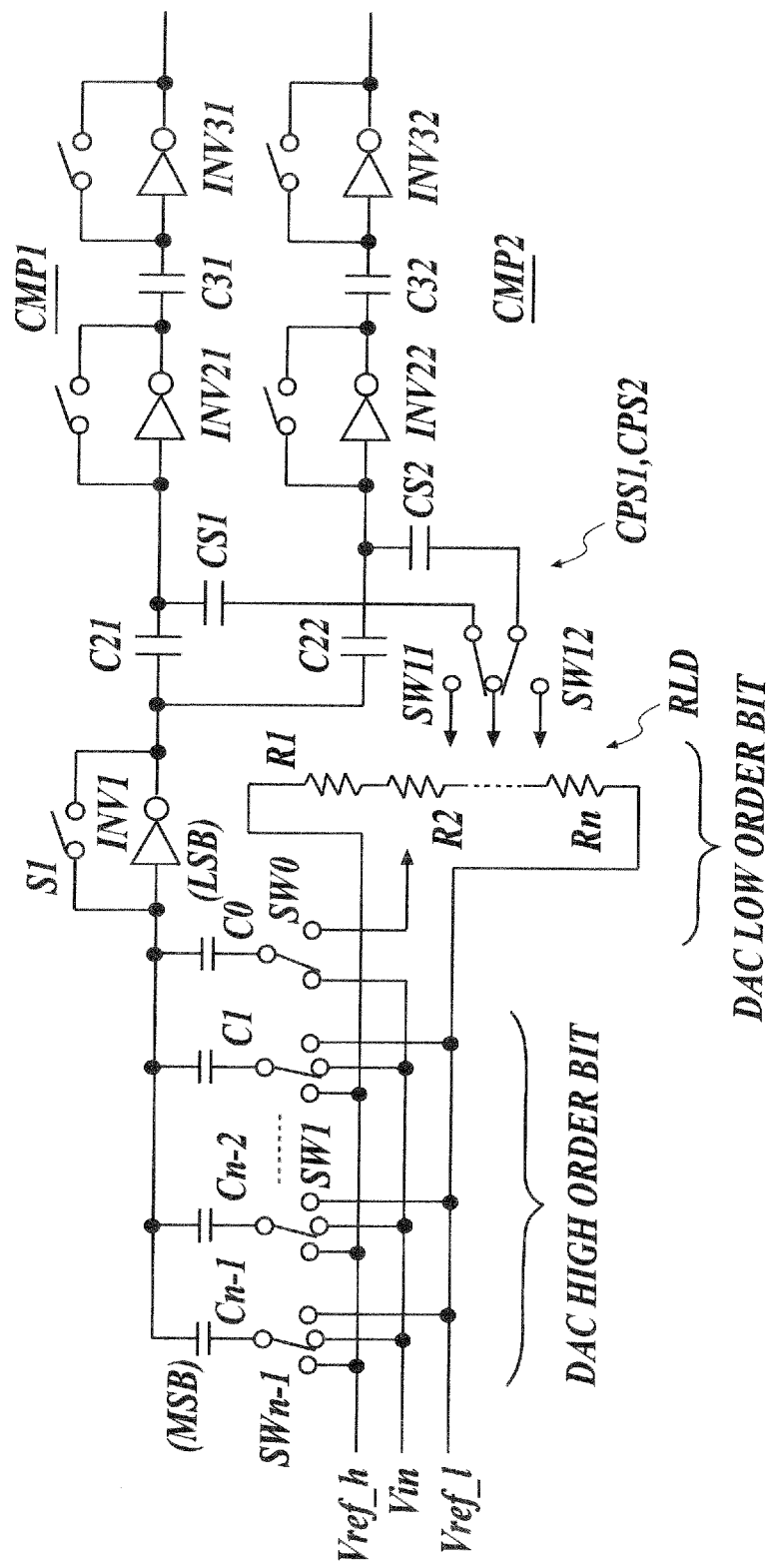
FIG. 9 This is a circuit arrangement showing the second embodiment of the successive approximation AD conversion circuit according to the present invention.

FIG. 9 shows the second embodiment of the successive approximation AD conversion circuit according to the present invention. In this embodiment, a DA conversion circuit in which a charge-distribution type and a resistance voltage dividing type are combined is used as the local DA conversion circuit, and the reference voltages Vref1, Vref1 and Vref2 which are to be applied to the capacitances CS1 and CS2 in the comparison point shift circuits CPS1 and CP S2 are taken out from the voltages divided in a ladder resistance RLD of the local DA conversion circuit 14 to be used.

The local DA conversion circuit 14 of FIG. 9 includes a capacitance array including weight capacitances C0, C1, . . . Cn−1 having a weight of nth power of 2 and the ladder resistance RLD constituted of resistances R1 to Rn in a serial configuration. The resistances R1 to Rn are usually set to the same resistance value. One of the terminals of each of the weight capacitances C0, C1, . . . Cn−1 is commonly connected and connected to the input terminal of the first inverter INV1 of the comparator 12.

Among the weight capacitances C0, C1, . . . Cn−1, any one of the reference voltages Vref_h and Vref_l and the input voltage Vin can be applied to the other terminal of each of C1, . . . Cn−1 by the switching switches SW1 to SWn−1. Further, either of the elected voltage of the ladder resistance RLD or the input voltage Vin can be applied to the other terminal of the weight capacitance C0 by the switching switch SW0. Here, the combination of the weight capacitances C0, C1, . . . Cn−1 corresponds to the sampling capacitance Cs of FIG. 1. Grounding potential can be used for the reference voltage Vref_l.

Although it is not shown in the drawing, a switch to take out potential of each node of the ladder resistance is provided in the ladder resistance RLD. In this embodiment, the switching switches SW0 to SWn−1 are controlled by bits in the higher order side of the successive approximation register 13 and the switch of the ladder resistance is controlled by bits in the lower order side of the register 13. In particular, when using the potential of the ladder resistance RLD by bits in the lower order side of the register 13, any one of the switches of the ladder resistance is turned on, and among the switching switches SW0 to SWn−1, only SW0 operates and SW1 to SWn−1 do not operate.

Moreover, when the weight capacitances C0, C1, . . . Cn−1 are to be used, the reference voltage Vref_h or Vref_l is transmitted to the capacitance C0 via the switch SW0. The SW1 to SWn−1 are connected to the input terminal of Vin at the time of sampling, and are connected to the reference voltage Vref_h or Vref_l according to the bit in the higher order side of the register 13 at the time of comparison judgment.

With respect to the switching switches SW0 to SWn−1, the connection terminals are decided according to the value of the successive approximation register 13 and the sampling clock. In FIG. 9, conditions of the switches during the sampling period are shown, and all of the switching switches SW0 to SWn−1 are connected to the input voltage Vin side and apply the input voltage Vin to the other terminals of the corresponding weight capacitances C0, C1, . . . Cn−1 to charge electric charges according to Vin. Further, the switching switches SW11 and SW12 are connected to the sides which applies an intermediate voltage (in the drawing, same voltage) to the capacitances CS1 and CS2 from the ladder resistance RLD.

During the comparison judgment period (hold period), the switching switches SW1 to SWn−1 are connected to eight one of Vref_h and Vref_l according to the value of the successive approximation register at that time. Further, the switching switch SW0 is the selected voltage of the ladder resistance RLD, and the voltage of which node is to be selected is to be decided according to the value of the successive approximation register. Furthermore, the switching switch SW11 is to be switched to the side of high voltage, and SW12 is to be switched to the side of low voltage.

In the local DA conversion circuit, by either reference voltage of Vref_h or Vref_l is to be applied to the other terminals of the weight capacitances C0, C1, . . . Cn−1 during the comparison judgment period, an electric changer corresponding to the potential difference between the applied voltage and the input voltage Vin which is applied just before remains and the electric charge is distributed among C0, C1, . . . Cn−1, and voltages generated at the common connection nodes are supplied to the input terminal of the inverter INV1 as a comparator.

In the comparator, by the switch S1 being turned on during the sampling period and the input/output of the inverter INV1 being short circuited, the input potential and the output potential be equal to the logic threshold value VLT of the inverter. Thereby, the input analog voltage Vin is to be sampled to the weight capacitances C0, C1, . . . Cn−1 by setting VLT as the reference. That is, an electric charge according to the potential difference between VLT and Vin is to be charged.

At the time of comparison judgment, as described above, the switching switches SW0 to SWn−1 are connected to the reference voltage Vref_h or Vref_l according to the value of the register 13 in the local DAC. Thereby, a potential corresponding to the potential difference between the input analog voltage which is sampled just before and the comparison voltage decided by the conditions of the switching switches SW0 to SWn−1 is supplied to the input terminal of the inverter INV1. Then, at this time, the switch S1 is turned off and the input terminal and the output terminal of the inverter INV1 are cut off. Therefore, the inverter acts as an amplifier, and amplifies and outputs the input potential.

In the resistance voltage dividing type DA converter, the reference voltage Vref_h is applied to one of the terminals of the ladder resistance RLD and the reference voltage Vref_l is applied to the other terminal of the ladder resistance RLD, and the potential difference of the above voltages is divided in a resistance ratio and either of the divided voltages is to be taken out by the switch which is controlled by the bit in the lower order side of the successive approximation register 13.

As described above, by combining the resistance voltage dividing type to the charge-distribution type, in the 10-bit DA conversion circuit, for example, only the capacitance which is $2^5$ times that of C0 and 32 resistances need to be provided, where as, a capacitance which is $2^{10}$ times (about 1000 times) the minimum capacitance C0 was needed when only the charge-distribution type is used, and there is an advantage with respect to area.

Moreover, in this embodiment, the switches SW11 and SW12 select either of the voltages generated in the ladder resistance RLD and apply the selected voltages to one of the terminals of the capacitances CS1 and CS2 of the comparison point shift circuits CPS1 and CPS2. Therefore, there is no need to provide the circuit of FIG. 1 which generates the reference voltages Vref0, Vref1 and Vref2 only for the comparison point shift circuits CPS1 and CPS2, and there is an advantage that the area can be small.

Here, in the embodiment of FIG. 9, the configuration in which the switches SW11 and SW12 select either of the voltages divided in the ladder resistance RLD and the selected voltages are applied to the one of the terminals of the capacitances CS1 and CS2 of the comparison point shift circuit CPS1 and CPS2 is shown. However, the configuration may be that the switches SW11 and SW12 select either of the voltages Vref_h or Vreg_l before being divided and apply to the one of the terminals of CS1 and CS2 instead of divided voltages. In such case, the switch SW11 performs switching such as Vref_l→Vref_h and the switch SW12 performs switching such as Vref_h→Vref_l. Such switching method can also be applied to a case where the local DA conversion circuit has no ladder resistance and is a circuit constituted only with weight capacitances and switching switches.

Next, another example of the chopper-type comparator in the AD conversion circuit of the above embodiments will be described. FIGS. 10 to 13 are examples in each of which a differential amplifier circuit is used instead of the CMOS inverter which constitutes the amplifier stage of the chopper-type comparator.

Figure 10:
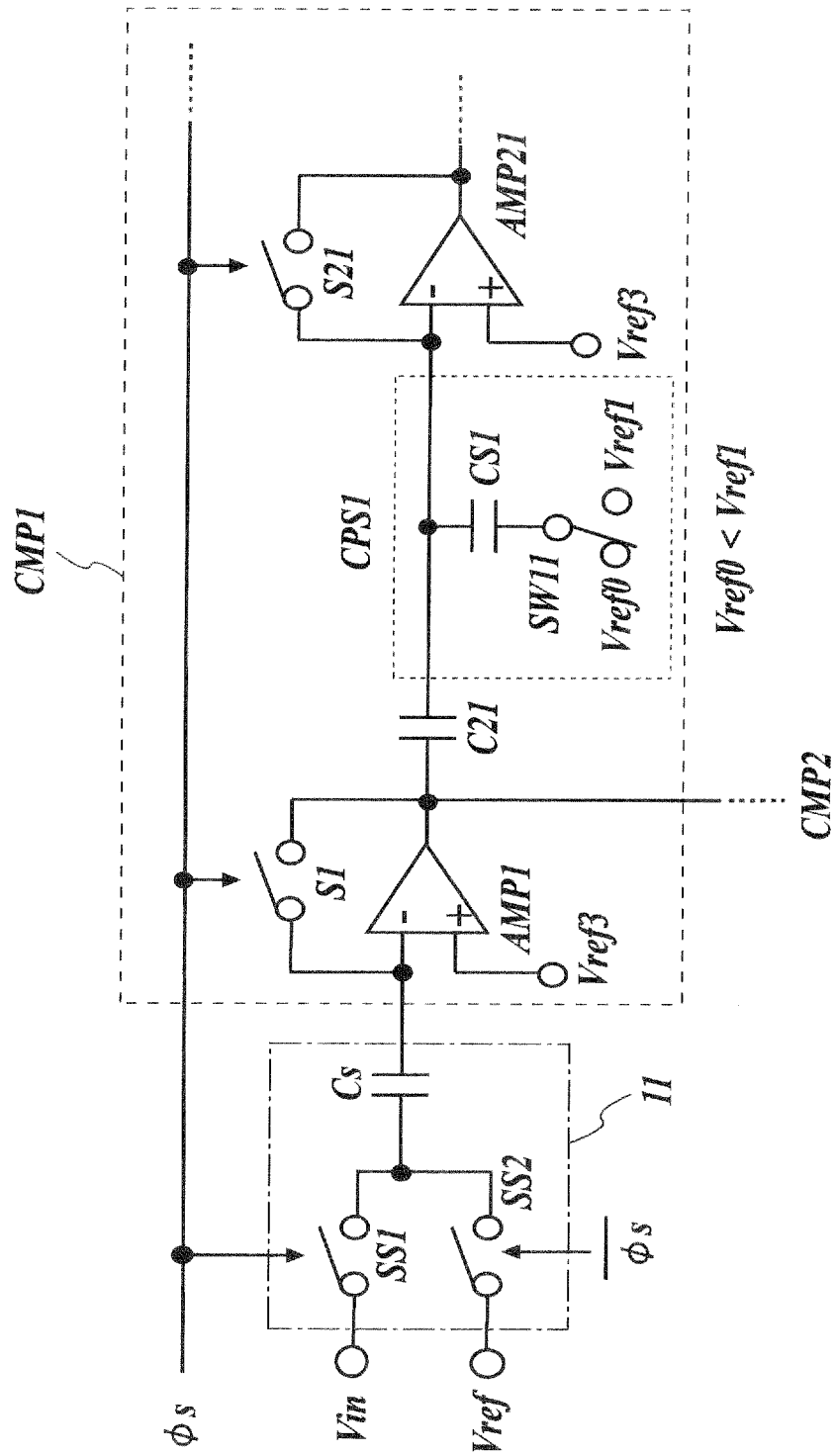
FIG. 10 This is a circuit arrangement showing another example of a chopper-type comparator in the AD conversion circuit of the present invention.

FIG. 10 is an example of a comparator in which a differential amplifier circuit of single end is used as an amplifier stage instead of CMOS inverter, and shows the sample hold circuit 11 and the first and second amplifier stages of the first comparator unit CMP1 in the comparator 12. The third amplifier stage, the second comparator unit CMP2 and the logic circuit LG are omitted from the drawing.

In the comparator of this example, one of the terminals of the sampling capacitance Cs is connected with an inverting input terminal of the first differential amplifier circuit AMP1 and a predetermined reference voltage Vref3 is applied to a non-inverting input terminal. Further, the inverting input terminal of the second differential amplifier circuit AMP2 is connected to the output terminal of the differential amplifier circuit AMP1 via the coupling capacitance C21, and the reference voltage Vref3 same as AMP1 is applied to the non-inverting input, terminal of the differential amplifier circuit AMP2.

Then, switches S1 and S21 for short circuiting the input/output are connected between the output terminals and the inverting input terminals of the differential amplifier circuits AMP1 and AMP2, respectively. Further, the comparison point shift circuit CPS1 constituted of the capacitance CS1 and the switching switch SW11 is connected to the inverting input terminal of the second differential amplifier circuit AMP2. Although it is not shown in the drawing, the above applies similarly in the second comparator unit CMP2.

The reference voltage Vref3 can be any voltage as long as it is a constant voltage. The input voltage is sampled to the sampling capacitance Cs by setting the constant voltage Vref3 as the reference. In the comparison point shift circuit CPS1, the switching switch SW11 is controlled so as to shift the comparison point by applying the voltage Vref0 to the capacitance Cs1 at the time of sampling and applying the voltage Vref1 which is higher than Vref0 at the time of comparison.

Although it is not shown in the drawing, in the second comparator unit (CMP2), the comparison point shift circuit (CPS2) is switched to a lower voltage Vref2 from the voltage Vref0 and operates so as to shift the comparison point in the direction opposite of the first comparator unit. By constituting the amplifier stage of the comparator 12 with the differential amplifier circuit as described above, conversion can be performed with higher accuracy comparing to the embodiments in which the amplifier stage is constituted with the CMOS inverter.

Figure 11:
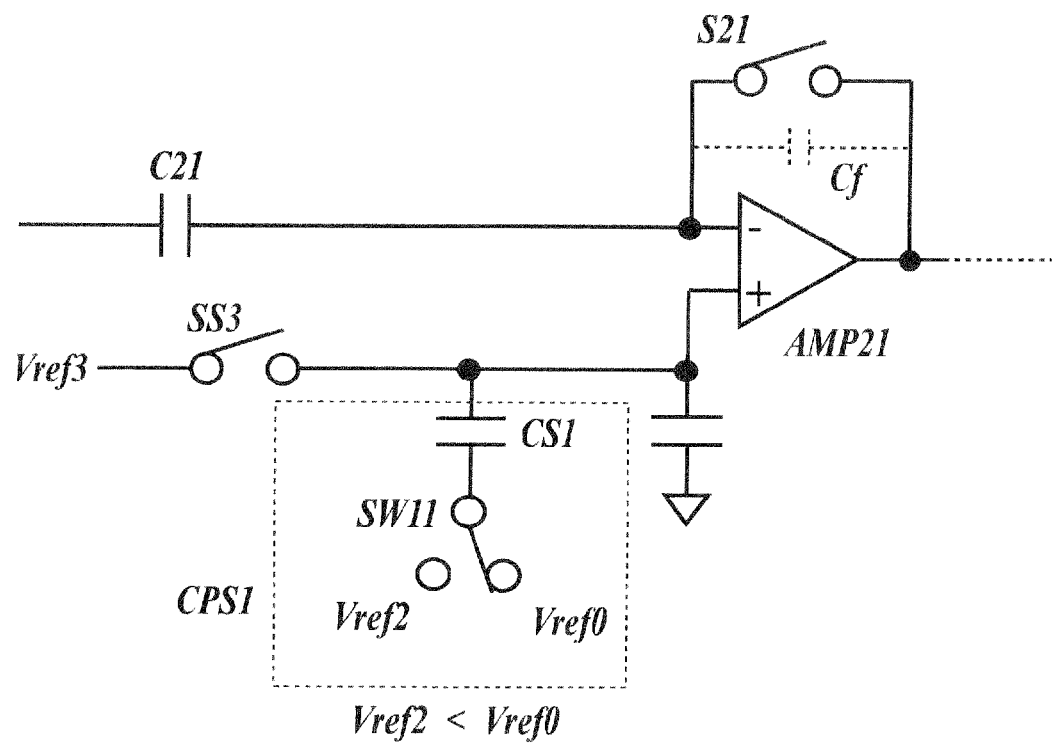
FIG. 11 This is a circuit arrangement showing the second embodiment in which a differential amplifier circuit is used for the amplifier stage of the comparator.

FIG. 11 shows another example in which the differential amplifier circuit is used as the amplifier stage of the comparator 12. Differently from the example of FIG. 10 in which the comparison point shift circuit CPS1 is connected to the inverting input terminal of the second difference amplifier circuit AMP2, in this example, CPS1 is connected to the non-inverting input terminal of AMP2. Further, an input switch SS3 is provided for applying the reference voltage Vref3 to the inverting input terminal of the differential amplifier circuit AMP2 at the time of sampling and for cutting off at the time of comparison. In contrast to the example of FIG. 10, the switching switch SW11 is controlled so as to apply voltage Vref0 at the time of sampling and to apply voltage Vref2 which is lower than the voltage Vref0 at the time of comparison in the comparison point shift circuit CPS1.

Figure 12:
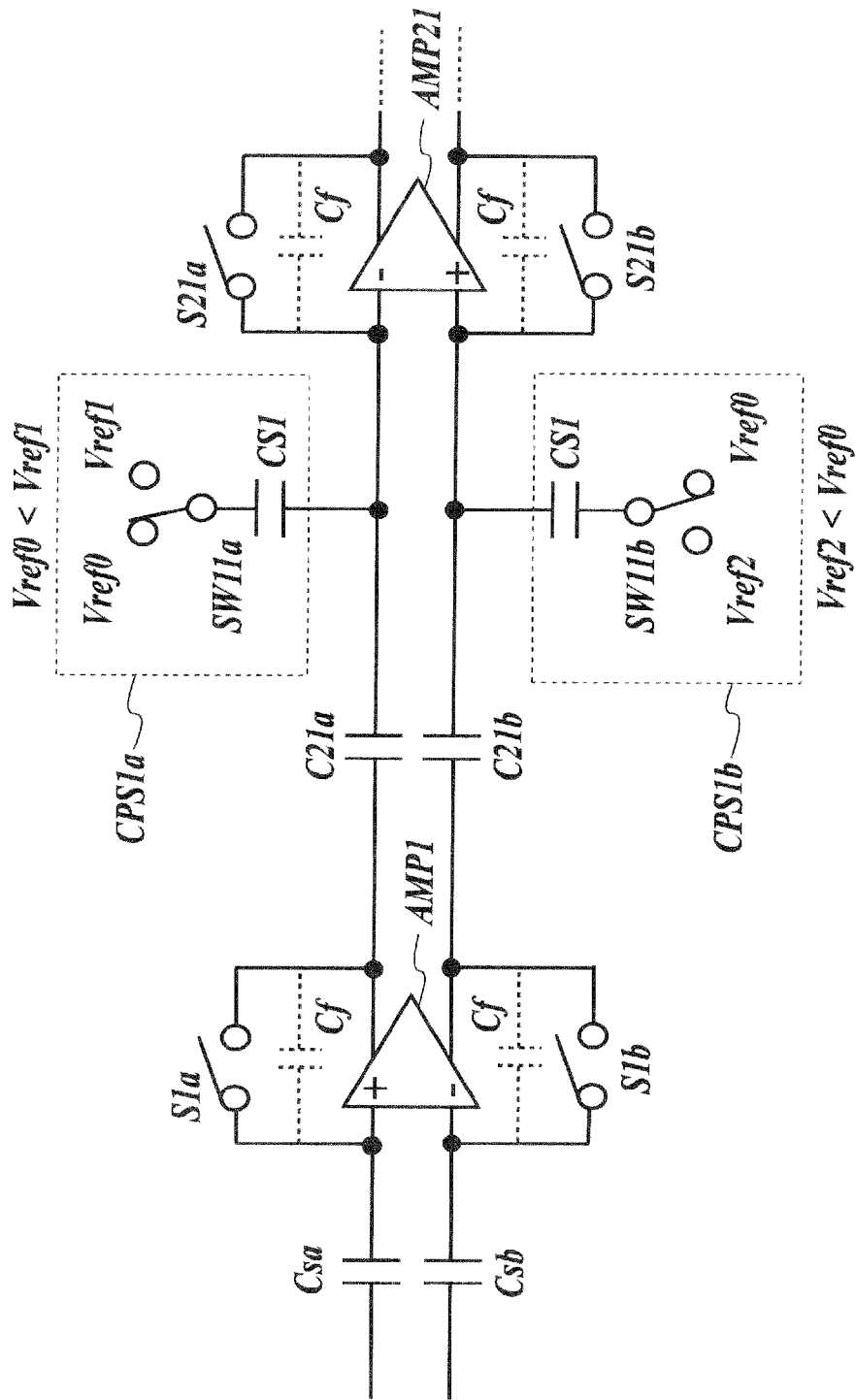
FIG. 12 This is a circuit arrangement showing the third embodiment in which differential amplifier circuits are used for the amplifier stages of the comparator.

FIG. 12 shows an example in which differential amplifier circuits are used as the amplifier stages of the comparator 12 and which is configured as a full-differential type comparator. In this example, the comparison point shift circuits CPS1a and CPS1b are connected to the inverting input terminal and the non-inverting input terminal of the second differential amplifier circuit AMP2, respectively. In the comparison point shift circuit CPS1a, the switching switch SW11a is controlled so as to apply voltage Vref0 at the time of sampling and to apply voltage Vref1 which is higher than the voltage Vref0 at the time of comparison. In the comparison point shift circuit CPS2, the switching itch SW11b is controlled so as to apply voltage Vref0 at the time of sampling and to apply voltage Vref2 which is lower than the voltage Vref0 at the time of comparison, contrary to CPS1.

Figure 13:
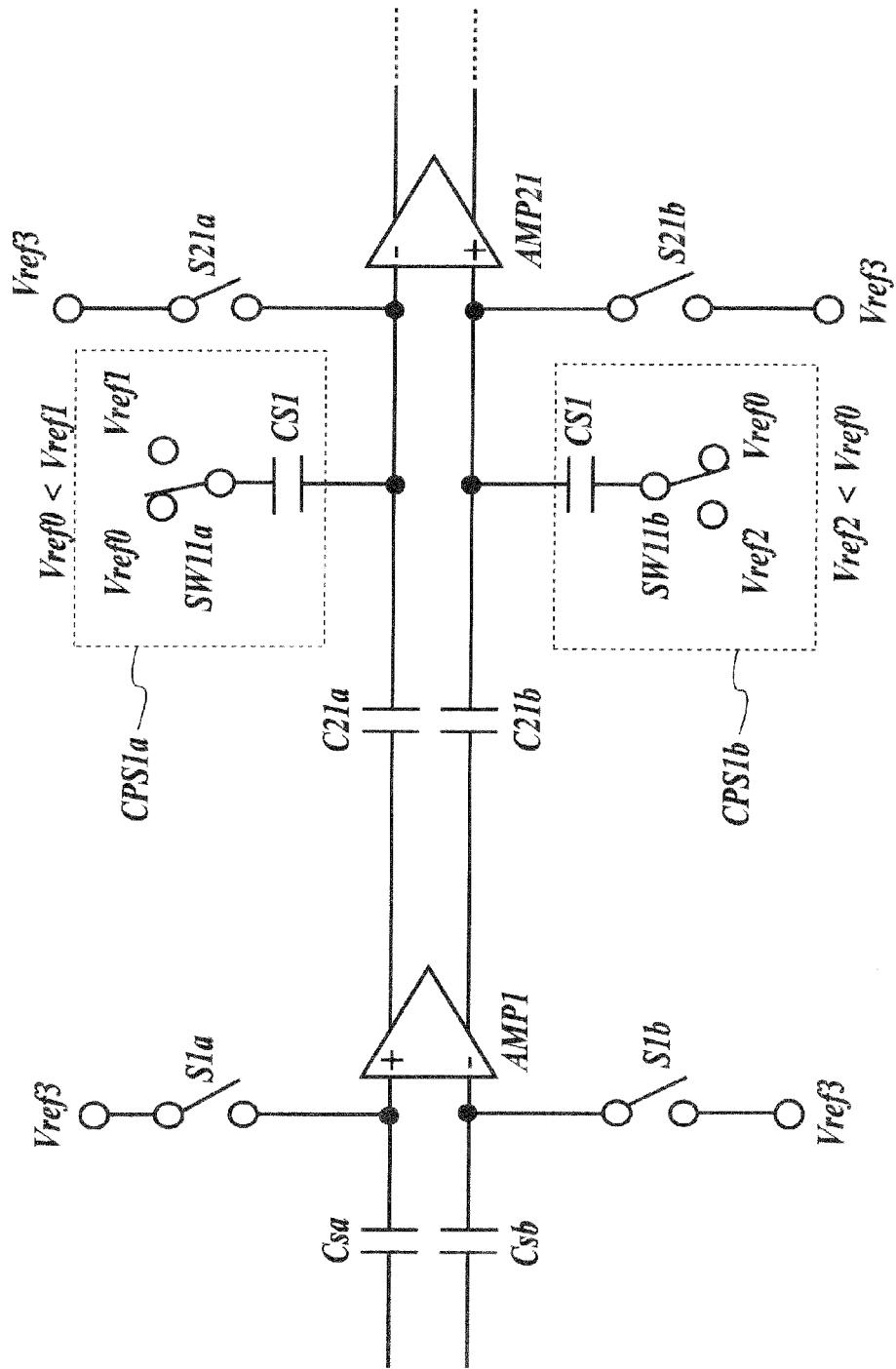
FIG. 13 This is a circuit arrangement showing a modification example of the third embodiment in which differential amplifier circuits are used for the amplifier stages of the comparator.
Figure 14:
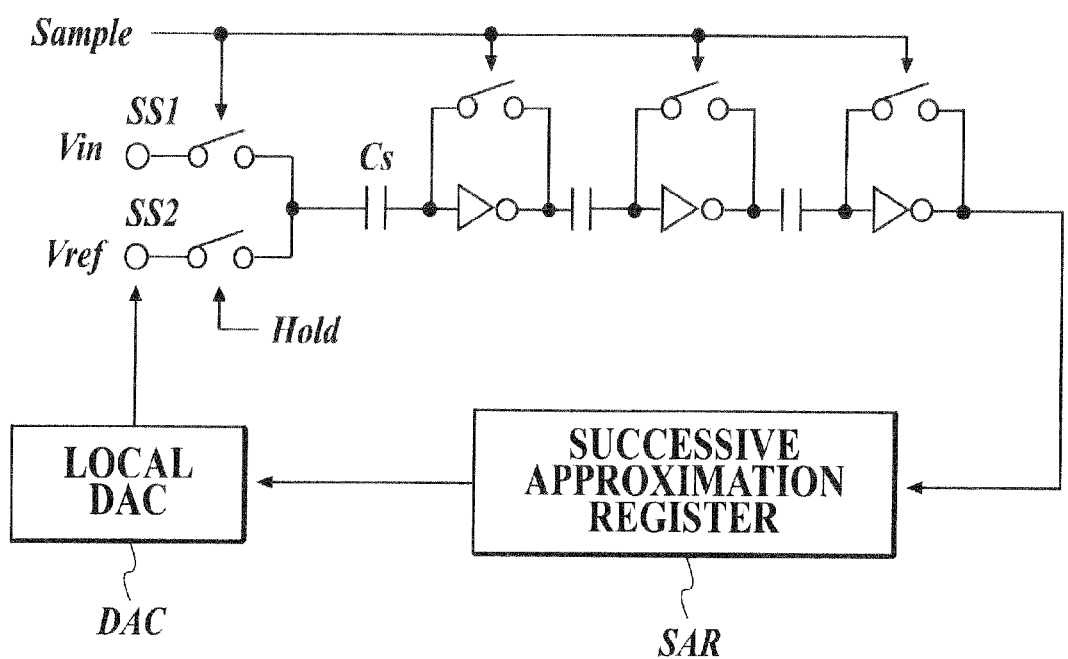
FIG. 14 This is a circuit arrangement showing a configuration example of a conventional AD conversion circuit including a chopper-type comparator.

FIG. 13 shows a modification example of the comparator 12 of the example of FIG. 12. This modification example is configured to connect one of the terminals of each of the switches S1a and S1b and one of the terminals of each of the switches S21a and S21b which are connected between input terminals and output terminals of the differential amplifier circuits AMP1 and AMP2, respectively, to the constant potential point to which the reference voltage Vref3 is applied, instead of the output terminals of AMP1 and AMP2. The comparator of the example in FIG. 12 is effective in both cases when a gain of the differential amplifier circuit is low and when a gain of the differential amplifier circuit is high. On the other hand, with respect to the comparator of the modification example in FIG. 13, a preferred result can be obtained when applied in a case where a gain of the differential amplifier circuit is low.

Here, the comparator which uses the differential amplifier circuit which has differential output as in FIGS. 12 and 13 can be also applied in a case where the signal from the previous stage is a single phase signal and not a differential signal. In such case, one input terminal of each differential amplifier circuit is to be connected and fixed to a constant potential such as a grounding potential via a capacitance device. Further, one input terminal of each differential amplifier circuit may be connected to the grounding potential and the power voltage via capacity devices. Thereby, with respect to noises which occur similarly in the grounding potential and the power voltage, outputs having very small influence of noises can be obtained by stabilizing the potential of the input terminals of the differential amplifier circuits.

In the above, the embodiments of the present invention achieved by the inventors are described in detail. However, the present invention is not limited to the above embodiments. For example, in the above embodiments, one capacitance CS1 and one capacitance CS2 of the comparison point shift circuit CPS1 and CPS2 is provided. However, a plurality of capacitances and switching switches can be provided and the capacitance to be connected to can vary.

Moreover, in the embodiment, the comparator in which three amplifier stages (CMOS inverters) are serially connected is shown. However, two amplifier stage may be serially connected or four amplifier stages can be serially connected. Further, in FIGS. 10 to n which the differential amplifier circuits are used, amplifier stages which is configured so as to adjust the gain by connecting the feedback capacitance Cf between input terminal and output terminal of each differential amplifier circuit as indicated in dotted lines in FIGS. 11 and 12, for example, can be used.

INDUSTRIAL APPLICABILITY

The present invention can be applied to AD conversion circuit including a chopper-type comparator.

DESCRIPTION OF REFERENCE NUMERALS 11 sample hold circuit
12 chopper-type comparator
13 successive approximation register
14 local DA conversion circuit
LG logic circuit
CMP1 first comparator unit
CMP2 second comparator unit
INV CMOS inverter (amplifier stage)
AMP differential amplifier circuit
CPS1, CPS2 comparison point shift circuit
SS1, SS2 sampling switch
S1, S21, S31, S22, S32 short circuiting switch
Cs sampling capacitance
C21, C31, C22, C32 coupling capacitance
RLD ladder resistance
C0 to Cn−1 weight capacitances
SW0 to SWn−1 switching switch

The invention claimed is:
1. A successive approximation AD conversion circuit, comprising:
a comparator circuit having a plurality of amplifier stages cascaded via coupling capacitances, which judges a magnitude of an input analog voltage and comparison voltages;
a register which sequentially takes in and holds judgment results of the comparator circuit; and
a local DA conversion circuit which converts values of the register to voltages and generates the comparison voltages,
wherein the comparator circuit includes:
a first comparator unit and a second comparator unit having a common first amplifier stage among the plurality of amplifier stages, the first comparator unit and the second comparator unit respectively having a first amplifier stage and a second amplifier state connected after the common first amplifier via coupling capacitances,
a first comparison point shift circuit connected to an input terminal of the first amplifier stage and a second comparison point shift circuit connected to an input terminal of the second amplifier stage, and a logic circuit which generates a predetermined code according to an output of the first comparator unit and an output of the second comparator unit and generates a value to store in the register by performing a calculation process to the generated code, wherein the first comparison point shift circuit and the second comparison point shift circuit operate so as to shift the comparison voltages by a specified amount in directions opposite from each other when amplifying a potential difference between the input analog voltage and the comparison voltages in the first comparator unit and the second comparator unit.

2. The successive approximation AD conversion circuit according to claim 1, wherein:

three types of codes are set for the predetermined code to be generated by the logic circuit, when a first code is generated, the local DA conversion circuit generates a voltage higher than a comparison voltage in a previous comparison operation in a next comparison operation, when a second code is generated, the local DA conversion circuit generates a voltage same as a comparison voltage in a previous comparison operation in a next comparison operation, and when a third code is generated, the local DA conversion circuit generates a voltage lower than a comparison voltage in a previous comparison operation in a next comparison operation.

3. The successive approximation AD conversion circuit according to claim 1, wherein the first comparison point shift circuit and the second comparison point shift circuit respectively include a first capacitance and a second capacitance in which one terminal of each of the first capacitance and the second capacitance is connected to the input terminal of the first amplifier stage or the input terminal of the second amplifier stage, and a first switching switch which switches a voltage to be applied to the other terminal of the first capacitance and a second switching switch which switches a voltage to be applied to the other terminal of the second capacitance, the first switching switch and the second switching switch switching the voltages in different directions from each other.

4. The successive approximation AD conversion circuit according to claim 3, wherein when a resolution of an AD conversion circuit is n-bit, a potential difference between an upper limit and a lower limit of an AD convertible voltage range is FS and a deviation amount of the comparison voltages which are shifted by the first comparison point shift circuit and the second comparison point shift circuit is $\Delta V$, a switching voltage or capacitance values of the first capacitance and the second capacitance change so as to fulfill $\Delta V$ $FS/2^n * 2^{(k-2)}$ when performing a comparison operation of $k^{th}$-bit.

5. The successive approximation AD conversion circuit according to claim 3, wherein when a resolution of an AD conversion circuit is n-bit, a potential difference between an upper limit and a lower limit of an AD convertible voltage range is FS and a deviation amount of the comparison voltages which are shifted by the first comparison point shift circuit and the second comparison point shift circuit is $\Delta V$, a switching voltage and capacitance values of the first capacitance and the second capacitance change so as to fulfill $\Delta V$ $FS/2^n * 2^{(k-2)}$ when performing a comparison operation of $k^{th}$-bit.

6. The successive approximation AD conversion circuit according to claim 4, wherein:

the local DA conversion circuit includes a capacitance array including a plurality of weight capacitances in which one terminal of each of the weight capacitances is commonly connected to an input terminal of the comparator circuit, and a switching switch circuit which can apply the input analog voltage, a first reference voltage or a second reference voltage to the other terminal of each of the plurality of weight capacitances, the local DA conversion circuit has a ladder resistance provided between a first node to which the first reference voltage is applied and a second node to which the second reference voltage is applied, and a selection unit which takes out a potential from any of the nodes of the ladder resistance, a connection condition of the switching switch circuit is decided according to values of a plurality of bits in a higher order side of the register, and the switching switch circuit applies the input analog voltage to the other terminal of each of the plurality of weight capacitances during a first period and applies the first reference voltage or the second reference voltage to the other terminal of each of the plurality of weight capacitances according to a value of the first register during a second period, a potential to be taken out is decided according to values of a plurality of bits in a lower order side of the register in the selection unit, and the potential taken out by the selection unit is applied to a terminal of a capacitance having a smallest capacitance value among the plurality of weight capacitances during the second period by the switching switch circuit, and voltages switched by the first switching switch and the second switching switch in the first comparison point shift circuit and the second comparison point shift circuit are taken out from any of the nodes of the ladder resistance of the local DA conversion circuit.

7. The successive approximation AD conversion circuit according to claim 1, wherein:

the comparator circuit is configured (i) to have CMOS inverts as the amplifier stages, switch devices provided between input/output, terminals of each of the CMOS inverters, and coupling capacitances provided between the CMOS inverters, (ii) to take in the input analog voltage by setting the voltage as a reference by applying a voltage corresponding to a logic threshold value of the CMOS inverters to one terminal of the sampling capacitance by the switch device being turned on during the first period, and (iii) to amplify a potential of the sampling capacitance in the CMOS inverters by an electric charge according to a potential difference between the input analog voltage and the comparison voltages being charged to the sampling capacitance and the switch device being turned off during the second period.

8. The successive approximation AD conversion circuit according to claim 1, wherein:

the comparator circuit is configured (i) to include differential amplifier circuits as the amplifier stages, switch devices provided between input/output terminals or between an input terminal and a constant potential point of each of the differential amplifier circuits, and a coupling capacitances provided between the differential amplifier circuits, (ii) to take in the input analog voltage in the sampling capacitance by the switch device being turned on during the first period, and (iii) to amplify a potential difference between the input analog voltage taken in to the sampling capacitance and the comparison voltages from the local DA conversion circuit in the differential amplifier circuits by the switch device being turned off during the second period.

* * * * *